United States Patent [19]

Joung

[11] Patent Number: 5,729,420
[45] Date of Patent: Mar. 17, 1998

[54] HIGH VOLTAGE RECOVERABLE INPUT PROTECTION CIRCUIT AND PROTECTION DEVICE

[75] Inventor: Jun-Ho Joung, Seoul, Rep. of Korea

[73] Assignee: Samsung Electronics Co., Ltd., Kyungki-do, Rep. of Korea

[21] Appl. No.: 761,855

[22] Filed: Dec. 9, 1996

[30] Foreign Application Priority Data

Dec. 20, 1995 [KR] Rep. of Korea ............. 95-52856

[51] Int. Cl.⁶ .................................. H02H 3/22
[52] U.S. Cl. ................ 361/111; 361/56; 257/355
[58] Field of Search ..................... 361/56, 91, 111, 361/58; 257/355–363

[56] References Cited

U.S. PATENT DOCUMENTS

| | | | |
|---|---|---|---|
| 4,989,057 | 1/1991 | Lu | 257/357 |
| 4,996,626 | 2/1991 | Say | 361/91 |
| 5,208,475 | 5/1993 | Mortensen | 257/360 |
| 5,272,586 | 12/1993 | Yen | 361/111 |
| 5,335,134 | 8/1994 | Stein et al. | 361/56 |
| 5,349,227 | 9/1994 | Murayama | 257/362 |
| 5,514,893 | 5/1996 | Miyananga et al. | 257/360 |
| 5,610,427 | 3/1997 | Shida | 257/362 |

*Primary Examiner*—Jeffrey A. Gaffin
*Assistant Examiner*—Michael J. Sherry
*Attorney, Agent, or Firm*—Myers, Bigel, Sibley & Sajovec

[57] ABSTRACT

An input protection device for protecting an input including a first transistor of a first conductivity type having a pair of controlled electrodes serially connected between a first reference voltage and the input and a controlling electrode connected to the input. A second transistor of a second conductivity type has its controlled electrodes serially connected between a second reference voltage and the input. The controlling electrode of the second transistor is connected to a second reference voltage. A third transistor of the first conductivity type has its controlled electrodes serially connected between the first reference voltage and the input and its controlling electrode connected to the first reference voltage. Optionally, a resistor connects the second of the pair of controlled electrodes of the second transistor and the second of the pair of controlled electrodes of the third transistor to the input. A device for use in input protection is also provided where the gate electrode of the device is formed on an insulator film which is formed on a gate oxide layer. The gate oxide layer is formed in an active layer with regions of doped semiconductor material.

21 Claims, 1 Drawing Sheet

HIGH VOLTAGE RECOVERABLE INPUT PROTECTION CIRCUIT AND PROTECTION DEVICE

FIELD OF THE INVENTION

The present invention relates to devices for the protection of devices against damage caused by voltage surges.

BACKGROUND OF THE INVENTION

Input protection has been applied to driver circuits for many different types of voltage sensitive devices. For example, input protection for liquid crystal displays are intended to protect the driver circuit and display from sudden voltage spikes or surges. Often, these voltage spikes or surges are the result of an electrostatic discharge which can occur as the devices are handled. Such electrostatic discharges may damage both the driver circuit and the display.

One conventional input protection circuit is illustrated in FIG. 1. Referring to FIG. 1, the conventional input protection circuit includes a pair of metal-oxide-semiconductor (MOS) transistors Q1 and Q2. One transistor Q1 is a P-type thin film transistor (TFT), and the other transistor Q2 is an N-type TFT. The drain terminals of the transistors Q1 and Q2 are connected to an input terminal. The source terminal and the gate terminal of the P-type transistor Q1 are connected to a voltage source designated Vdd. The source terminal and the gate terminal of the N-type transistor Q2 are grounded.

In the input protection circuit of FIG. 1, positive surge current is discharged to the power source Vdd through the P-type transistor Q1, and negative surge current is discharged to ground through the N-type transistor Q2. When a small surge voltage is applied, the surge current is discharged to the voltage source by the normal operation of the P-type transistor Q1. However, when the surge voltage is more than twice the supply voltage Vdd, the P-type transistor Q1 may be damaged. Thus, when a large positive surge voltage is applied to the input terminal a corresponding negative gate voltage of the same value as the large positive surge voltage is induced in the gate terminal of the P-type transistor Q1. The negative gate voltage may damage the transistor.

In view of the above discussion, improvements are needed in input protection circuits in that conventional input protection may not withstand a large amount of positive surge voltage.

SUMMARY OF THE INVENTION

In light of the limitations of conventional input protection, it is one object of the present invention to provide an input protection circuit which may dissipate large positive voltage surges.

It is a further object of the present invention to provide an input protection circuit which may continue to function after dissipation of large positive voltage surges.

These and other objects are met by providing an input protection circuit for protecting an input which includes a first transistor of a first conductivity type having a pair of controlled electrodes serially connected between a first reference voltage and the input and a controlling electrode connected to the input. A second transistor of a second conductivity type has its controlled electrodes serially connected between a second reference voltage and the input. The controlling electrode of the second transistor is connected to a second reference voltage. A third transistor of the first conductivity type has its controlled electrodes serially connected between the first reference voltage and the input and its controlling electrode connected to the first reference voltage. The first transistor aids in the dissipation of larger positive voltage surges as its threshold is such that it activates when an a larger positive voltage surge is received at the input terminal. Thus, when a damaging voltage surge is present at the input terminal, the first transistor may activate to prevent damage to the other transistors.

In a particular embodiment of the present invention an input protection circuit provides a first N-type transistor with its source grounded and its drain and gate connected to an input. A P-type transistor is also included with its drain connected to the input and its source and gate connected to a voltage source. This P-type transistor dissipates positive voltage surges. A second N-type transistor is also included and has its drain connected to the input, and source and gate grounded. This N-type transistor dissipates negative voltage surges.

In an alternative embodiment of the present invention, an input protection circuit for protecting an input is provided which includes a resistor connecting the second of the pair of controlled electrodes of the second transistor and the second of the pair of controlled electrodes of the third transistor to the input. Thus, the second and third transistors are not directly connected to the input but are connected through a resistance. In such an input protection circuit, the first transistor activates to dissipate large positive voltage surges. The resistor delays the large positive surge voltage from reaching the second and third transistors before activation of the first transistor. Thus, the first transistor in combination with the resistor may reduce the voltage pulse to a level which does not cause damage to the other transistors.

Another embodiment of the present invention includes a first N-type transistor with its source grounded, and its drain and gate connected to an input. A P-type transistor is also included with its source and gate connected to a voltage source. A second N-type transistor has its source and gate grounded. A resistor connects the drain of the P-type transistor and the drain of the second N-type transistor to the input.

In the present invention, preferably, the threshold voltage of the first transistor is less than about twice the second reference voltage. Also, the threshold voltage of the first transistor may be less than the breakdown voltage of the second transistor and may also be greater than the threshold voltage of the second transistor. In particular embodiments, the threshold voltage of the first N-type MOS transistor is preferably over 30 V.

In a particular embodiment of the present invention, an input protection device for a driving circuit for a polycrystalline silicon liquid crystal display is provided. This device includes an active layer made of a semiconductor material such as polycrystalline silicon and having two doped regions. This active layer is formed on a substrate. A gate oxide layer is formed on the active layer and an insulator film formed on the gate oxide layer. A gate electrode is formed on the insulator film. A source opening and a drain opening are formed in the gate oxide layer and the insulator film and extend to the doped regions of the active layers. The input protection device of a driving circuit for a polycrystalline silicon liquid crystal display in accordance with the present invention may further include electrodes formed through the opening of the gate oxide layer and the insulator film and connected to the doped regions of the active layer.

In particular preferred embodiments, the thickness of the gate oxide layer may be over about 1,000 Å, and the thickness of the insulator film may be over about 6,000 Å. The thickness of the combined insulator layer is preferably greater than about 7,000 Å.

DESCRIPTION OF THE PREFERRED EMBODIMENTS

Figure 1:
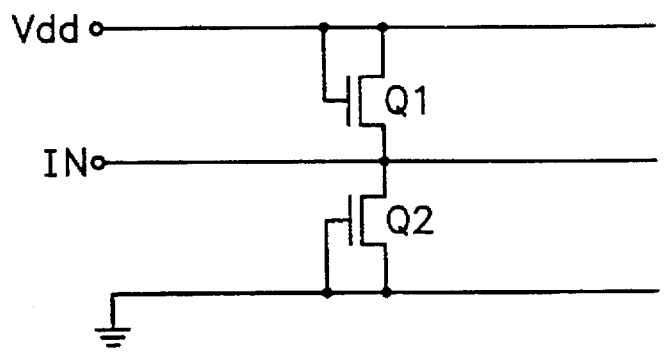
FIG. 1 is a circuit diagram illustrating a conventional input protection circuit for a polycrystalline silicon liquid crystal display.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Moreover, the terms "first conductivity type" and "second conductivity type" refer to opposite conductivity types such as N or P-type and each embodiment described and illustrated herein includes its complementary embodiment as well.

Figure 2:
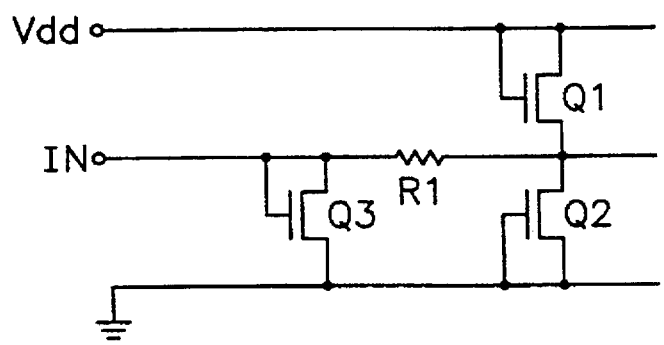
FIG. 2 is a circuit diagram illustrating an input protection circuit in accordance with a preferred embodiment of the present invention.
Figure 3:
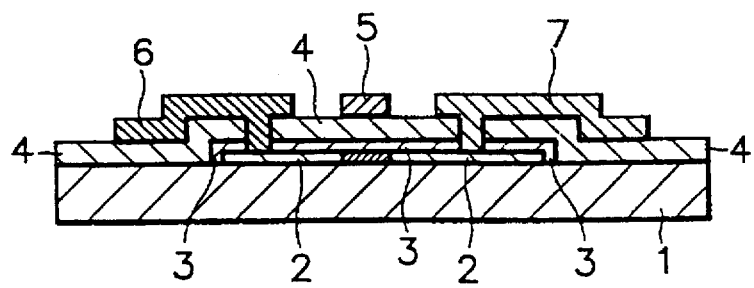
FIG. 3 is a cross-sectional view illustrating a device for which may be utilized in an input protection circuit of the present invention.

FIG. 2 is a circuit diagram illustrating an input protection circuit in accordance with a preferred embodiment of the present invention. Referring to FIG. 2, a first transistor Q3 of a first conductivity type has a pair of controlled terminals and a controlling terminal. Such a transistor may be an N-type MOS transistor Q3 with a source and drain as controlled terminals and the gate as a controlling terminal. As seen in FIG. 3, transistor Q3 has its gate and drain connected to an input "IN." The source of the transistor Q3 is connected to ground. Likewise, transistors Q1 and Q2 also have a pair of controlled terminals, illustrated as a source and a drain, and a controlling terminal, illustrated as a gate. An optional resistor R1 is illustrated as connected to the input terminal IN and one of the controlled terminals (the drain) of transistors Q1 and Q2. In addition, a voltage Vdd is applied to the source and gate of the second conductivity type transistor Q1 which in the present example is a P-type transistor. As will be appreciated by those of skill in the art, the voltage source Vdd may be any suitable form of voltage source such as regulated power supplies, unregulated power supplies or other voltage sources known to those of skill in the art. The third transistor Q2 is formed of the first conductivity type and is illustrated in FIG. 3 as an N-type transistor. The source and gate of the third transistor Q2 are grounded. In the absence of the optional resistor R1 the drains of transistors Q1 and Q2 are connected to the drain of transistor Q3 and input IN.

In operation, the P-type transistor Q1 operates to discharge surge current to a voltage source (Vdd) when a positive surge voltage less than the threshold voltage of the N-type transistor Q3 is present at the input IN. The N-type transistor Q3 is turned ON, thereby discharging the surge current to ground, when a positive surge voltage greater than the threshold voltage of the N-type transistor Q3 is present at the input IN. Thus, if a large voltage spike is presented to the input IN, transistor Q3 activates to dissipate the spike before it can damage transistor Q1.

If optional resistor R1 is present in the input protection circuit, the resistor R1 acts as a delay device to delay the large voltage spike from reaching the transistors Q1 and Q2 without dissipation by the transistor Q3. The resistor R1 further prevents the P-type transistor Q1 from being damaged because most of the surge current flows to the N-type transistor Q3. The remaining small current flows to the transistors Q1 and Q2 and the voltage is lowered through the resistor R1 before it is transmitted to the transistors Q1 and Q2.

In a preferred embodiment of the present invention, the threshold voltage of the N-type transistor Q3 should be high enough such that input signals presented to the input IN are below the threshold voltage and, therefore, not dissipated by the transistor Q3. However, to reduce the likelihood of damage to the other transistors in the circuit, the threshold voltage of Q3 may be selected to be less than twice the voltage of voltage source Vdd. The threshold voltage of transistor Q3 may also be selected to be less than the breakdown voltage of transistor Q1. It may also be desirable that the threshold voltage of Q3 be selected such that it is greater than the threshold voltage of Q1. Furthermore, because transistor Q3 is preferably only activated during high voltage surges, the breakdown voltage of transistor Q3 should be high. The N-type transistor having a cross-sectional structure as illustrated in FIG. 3 may be utilized in the preferred embodiment of the present invention to provide the desired threshold voltage and breakdown voltages.

The N-type MOS transistor Q3 is preferably a polycrystalline silicon thin film transistor which has the cross-sectional structure illustrated in FIG. 3. As seen in FIG. 3, an active layer 2 of semiconductor material, which is preferably formed of polycrystalline silicon, is formed on a substrate 1 which is preferably formed of transparent insulating material such as glass or quartz. The active layer 2 has two doped regions of semiconductor material separated by a central, undoped region of semiconductor material.

A gate oxide layer 3 is formed on the active layer 2. The gate oxide layer 3 has openings formed to expose the doped regions of the active layer 2. An insulator film 4 is also formed on the gate oxide layer 3 and has corresponding openings to those of the gate oxide layer 3 such that the doped regions of the active layer 2 are exposed. A gate electrode 5 made of conducting material is formed on a central region of the insulator film 4 above the non-doped region of the active layer 2. Source and drain electrodes 6 and 7 are formed through the openings in the gate oxide layer 3 and the insulator film 4 to contact the doped regions of the active layer 3. The source and drain electrodes 6 and 7 are formed on opposite sides of the gate electrode 5 such that when a bias is applied to the gate electrode 5, current may flow between the source and the drain electrodes 6 and 7.

As is illustrated in FIG. 3 the N-type MOS transistor in accordance with the preferred embodiment of the present invention has the gate electrode 5 formed on the gate oxide layer 3 and the insulator film 4. As such, both the gate oxide layer 3 and the insulator film 4 are used as a combined gate insulator film of the transistor. The thickness of the gate oxide layer used as the gate insulator film of a general MOS transistor is about 1,000 Å. However, the thickness of the combined gate insulator film of the present invention is preferably about 7,000 Å. Such a thickness is achieved by the insulator film 4 having a preferred thickness of more than about 6,000 Å and the gate oxide layer 3 having a preferred thickness of about 1,000 Å. In such a device, a threshold voltage of over 30 V may be obtained with a combined gate insulator film having a thickness of over 7,000 Å. Furthermore, the increased thickness of the combined gate insulator film increases the breakdown voltage of the transistor. Accordingly, such a device may discharge the current for large voltage surges without damage to the device. By utilization of the high threshold device of FIG. 3 in the circuit of FIG. 2, a large positive voltage surge is discharged to the ground, thereby protecting the protection device and the internal circuits from damaging voltage surges.

The above described invention has been discussed with respect to formation of the device in silicon. However, as will be appreciated by those of skill in the art, other types of semiconductor material may be utilized while retaining the benefits of the teachings of the present invention. Furthermore, as will also be appreciated by those of skill in the art, the present invention may implemented utilizing discrete components, hybrid devices, integrated circuits or any combination thereof.

In the drawings and specification, there have been disclosed typical preferred embodiments of the invention and, although specific terms are employed, these terms are used in a generic and descriptive sense only and not for purposes of limitation, the scope of the invention being set forth in the following claims.

That which is claimed:

1. An input protection circuit for protecting an input, comprising:
    a first transistor of a first conductivity type having a pair of controlled electrodes serially connected between a ground and said input and having a controlling electrode connected to said input;
    a second transistor of a second conductivity type having a pair of controlled electrodes serially connected between a reference voltage and said input and having a controlling electrode connected to said reference voltage; and
    a third transistor of said first conductivity type having a pair of controlled electrodes serially connected between ground and said input and having a controlling electrode connected to ground.

2. An input protection circuit according to claim 1, wherein said first conductivity type comprises N-type conductivity and said second conductivity type comprises P-type conductivity.

3. An input protection circuit according to claim 1, wherein said reference voltage comprises a supply voltage.

4. An input protection circuit according to claim 1, wherein said first transistor comprises an N-type transistor, said controlled electrodes comprise a source electrode and a drain electrode and said controlling electrode comprises a gate electrode wherein the source of said first transistor is grounded, and the drain and gate of said first N-type transistor is connected to said input;
    wherein said second transistor comprises a P-type transistor, said controlled electrodes comprise a source electrode and a drain electrode and said controlling electrode comprises a gate electrode wherein the drain of said P-type transistor is connected to said input, and the source and gate of said P-type transistor are connected to a voltage source; and
    wherein said third transistor comprises an N-type transistor, said controlled electrodes comprise a source electrode and a drain electrode and said controlling electrode comprises a gate electrode wherein the drain of said third transistor is connected to said input and the source and gate of said third transistor are grounded.

5. The input protection circuit of claim 1, wherein said first transistor has a threshold voltage of greater than about 30 V.

6. The input protection circuit of claim 1, wherein the threshold voltage of said first transistor is greater than the threshold voltage of said second transistor.

7. An input protection circuit for protecting an input, comprising:
    a first transistor of a first conductivity type having a pair of controlled electrodes and a controlling electrode, wherein said pair of controlled electrodes are serially connected to a first reference voltage and said input and wherein said controlling electrode is connected to said input;
    a second transistor of a second conductivity type having a pair of controlled electrodes and a controlling electrode, wherein a first electrode of said pair of controlled electrodes and said controlling electrode are connected to a second reference voltage;
    a third transistor of said first conductivity type having a pair of controlled electrodes and a controlling electrode, wherein a first electrode of said pair of controlled electrodes and said controlling electrode are connected to said first reference voltage; and
    a resistor connecting the second of said pair of controlled electrodes of said second transistor and the second of said pair of controlled electrodes of said third transistor to said input.

8. An input protection circuit according to claim 7, wherein said first conductivity type comprises N-type conductivity and said second conductivity type comprises P-type conductivity.

9. An input protection circuit according to claim 7, wherein said first reference voltage comprises ground.

10. An input protection circuit according to claim 9, wherein said second reference voltage comprises a supply voltage.

11. An input protection circuit according to claim 7, wherein said first transistor comprises an N-type transistor, said controlled electrodes comprise a source electrode and a drain electrode and said controlling electrode comprises a gate electrode, wherein the source of said first transistor is grounded and the drain and gate of said first transistor is connected to said input;
    wherein said second transistor comprises a P-type transistor, said controlled electrodes comprise a source electrode and a drain electrode and said controlling electrode comprises a gate electrode wherein the source and gate of said second transistor are connected to a voltage source;
    wherein said third transistor comprises an N-type transistor, said controlled electrodes comprise a source electrode and a drain electrode and said controlling electrode comprises a gate electrode wherein the source and gate of said third transistor are grounded; and
    wherein said resistor connects the drain of said second transistor and the drain of said third transistor to said input.

12. The input protection circuit of claim 7, wherein said first transistor has a threshold voltage of greater than about 30 V.

13. The input protection circuit of claim 7, wherein said first transistor has a threshold voltage of less than about twice said second reference voltage.

14. The input protection circuit of claim 7, wherein the threshold voltage of said first transistor is greater than the threshold voltage of said second transistor.

15. The input protection circuit of claim 7, wherein said first transistor comprises:
   a substrate;
   an active layer of semiconductor material formed on said substrate, said active layer having regions of doped semiconductor material separated by a region of undoped semiconductor material;
   a gate oxide layer formed on said active layer;
   an insulator film formed on said gate oxide layer; and
   a gate electrode formed on said insulator film opposite said region of undoped semiconductor material.

16. An input protection circuit for protecting an input, comprising:
   a first transistor of a first conductivity type having a pair of controlled electrodes serially connected between a first reference voltage and said input and having a controlling electrode connected to said input;
   a second transistor of a second conductivity type having a pair of controlled electrodes serially connected between a second reference voltage and said input and having a controlling electrode connected to said second reference voltage;
   a third transistor of said first conductivity type having a pair of controlled electrodes serially connected between said first reference voltage and said input and having a controlling electrode connected to said first reference voltage; and
   wherein said first transistor has a threshold voltage of less than about twice said second reference voltage.

17. An input protection circuit according to claim 16, wherein said first conductivity type comprises N-type conductivity and said second conductivity type comprises P-type conductivity.

18. An input protection circuit according to claim 16, wherein said second reference voltage comprises a supply voltage.

19. An input protection circuit according to claim 16, wherein said first transistor comprises an N-type transistor, said controlled electrodes comprise a source electrode and a drain electrode and said controlling electrode comprises a gate electrode wherein the source of said first transistor is grounded, and the drain and gate of said first N-type transistor is connected to said input;
   wherein said second transistor comprises a P-type transistor, said controlled electrodes comprise a source electrode and a drain electrode and said controlling electrode comprises a gate electrode wherein the drain of said P-type transistor is connected to said input, and the source and gate of said P-type transistor are connected to a voltage source; and
   wherein said third transistor comprises an N-type transistor, said controlled electrodes comprise a source electrode and a drain electrode and said controlling electrode comprises a gate electrode wherein the drain of said third transistor is connected to said input and the source and gate of said third transistor are grounded.

20. The input protection circuit of claim 16, wherein said first transistor has a threshold voltage of greater than about 30 V.

21. The input protection circuit of claim 16, wherein the threshold voltage of said first transistor is greater than the threshold voltage of said second transistor.

* * * * *